US009547055B2

(12) United States Patent
Biber et al.

(10) Patent No.: US 9,547,055 B2
(45) Date of Patent: Jan. 17, 2017

(54) IDENTIFYING THE STATIC POSITION OF TRANSMISSION/RECEPTION COILS OF A MAGNETIC RESONANCE IMAGING SCANNER WITH THE AID OF ELECTRONICALLY READABLE LABELS

(71) Applicants: Stephan Biber, Erlangen (DE); Gerhard Metz, München (DE)

(72) Inventors: Stephan Biber, Erlangen (DE); Gerhard Metz, München (DE)

(73) Assignee: Siemens Aktiengesellschaft, München (DE)

(*) Notice: Subject to any disclaimer, the term of this patent is extended or adjusted under 35 U.S.C. 154(b) by 664 days.

(21) Appl. No.: 13/974,609

(22) Filed: Aug. 23, 2013

(65) Prior Publication Data

US 2014/0055132 A1     Feb. 27, 2014

(30) Foreign Application Priority Data

Aug. 23, 2012  (DE) ........................ 10 2012 215 004

(51) Int. Cl.
| G01V 3/00 | (2006.01) |
| G01R 33/36 | (2006.01) |
| G01R 33/3415 | (2006.01) |

(52) U.S. Cl.
CPC ........... *G01R 33/36* (2013.01); *G01R 33/3664* (2013.01); *G01R 33/3692* (2013.01); *G01R 33/3415* (2013.01)

(58) Field of Classification Search
CPC . G01R 33/36; G01R 33/3664; G01R 33/3692; G01R 33/3415

USPC ......................................... 324/307, 322, 318
See application file for complete search history.

(56) References Cited

U.S. PATENT DOCUMENTS

| 6,034,529 | A   | * | 3/2000 | Kolem ............. | G01R 33/34053 |
|           |     |   |        |                    | 324/318       |
| 7,230,425 | B2  | * | 6/2007 | Leussler ............ | G01R 33/3692 |
|           |     |   |        |                    | 324/318       |
| 7,319,325 | B2  | * | 1/2008 | Petot ...................... | G01R 33/28 |
|           |     |   |        |                    | 324/309       |
| 7,330,030 | B2  | * | 2/2008 | Nakabayashi ..... | G01R 33/3415 |
|           |     |   |        |                    | 324/309       |
| 7,336,076 | B2  | * | 2/2008 | Kuhara ............. | G01R 33/5611 |
|           |     |   |        |                    | 324/307       |

(Continued)

FOREIGN PATENT DOCUMENTS

| DE | 10314215 B4 | 11/2006 |
| WO | WO2005017548 A1 | 2/2005 |

OTHER PUBLICATIONS

German Office Action cited in German Application No. 10 2012 215 004.8, mailed May 17, 2013.

*Primary Examiner* — Susan Lee
(74) *Attorney, Agent, or Firm* — Lempia Summerfield Katz LLC

(57) ABSTRACT

A device for identifying a position of a local coil of a magnetic resonance imaging scanner relative to a position of a patient couch includes at least one label configured to transmit a signal with at least one identity number wirelessly, and at least one reading unit with a reading-unit antenna. The at least one reading unit is configured to receive the signal. The device also includes a position determination apparatus configured to determine the position of the local coil relative to the patient couch.

24 Claims, 4 Drawing Sheets

(56) References Cited

U.S. PATENT DOCUMENTS

| | | | | |
|---|---|---|---|---|
| 2005/0253584 A1* | 11/2005 | Campagna | ......... | G01R 33/3415 324/318 |
| 2008/0147442 A1* | 6/2008 | Warner | ................ | A61G 7/018 705/3 |
| 2010/0052682 A1* | 3/2010 | Mueller | ............. | G01R 33/3692 324/318 |
| 2010/0156421 A1* | 6/2010 | Sukkau | ............. | G01R 33/3415 324/318 |
| 2010/0182005 A1* | 7/2010 | Biber | ................ | G01R 33/341 324/307 |
| 2010/0272229 A1* | 10/2010 | Biber | ................ | G01R 33/3415 378/20 |

* cited by examiner

IDENTIFYING THE STATIC POSITION OF TRANSMISSION/RECEPTION COILS OF A MAGNETIC RESONANCE IMAGING SCANNER WITH THE AID OF ELECTRONICALLY READABLE LABELS

This application claims the benefit of DE 10 2012 215 004.8, filed on Aug. 23, 2012, which is hereby incorporated by reference.

BACKGROUND

The present embodiments relate to methods and devices for identifying the position of transmission/reception coils of an MRI scanner.

Magnetic resonance imaging scanners (MRI scanners) for examining objects or patients by magnetic resonance imaging are known from, for example, DE10314215B4.

SUMMARY

The scope of the present invention is defined solely by the appended claims and is not affected to any degree by the statements within this summary.

The present embodiments may obviate one or more of the drawbacks or limitations in the related art. For example, the identification of the position of transmission/reception coils of a magnetic resonance imaging scanner relative to a patient couch is optimized.

DETAILED DESCRIPTION

Figure 5:
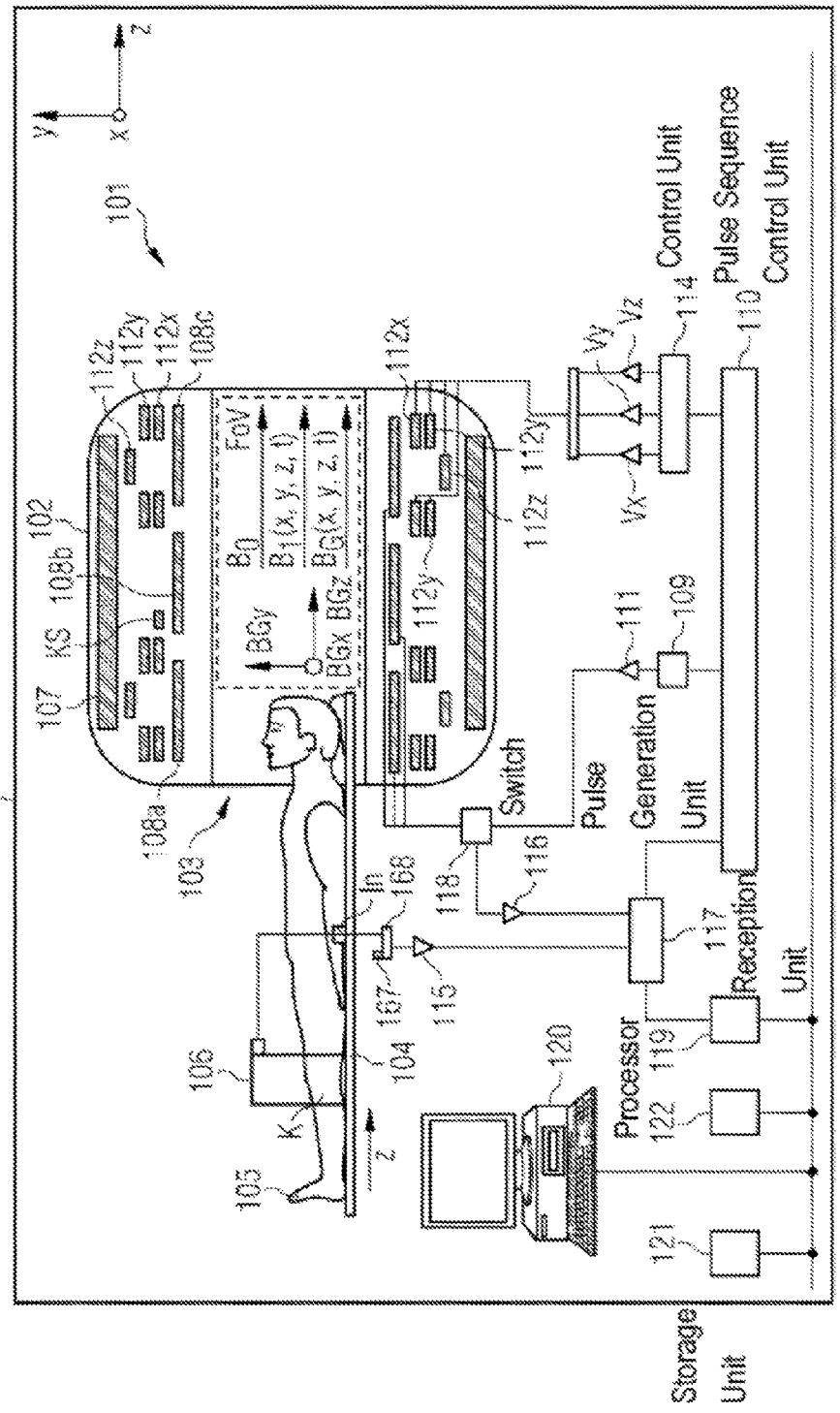
FIG. 5 shows one embodiment of an MRI system.

FIG. 5 shows one embodiment of a magnetic resonance imaging MRI scanner 101 (e.g., situated in a shielded room or in a Faraday cage F) with a whole body coil 102 with a space 103 (e.g., tubular), in which a patient couch 104 (e.g., a patient table) with a body of, for example, an examination object 105 (e.g., of a patient; with or without local coil arrangement 106) may be driven in the direction of the arrow z in order to generate images (e.g., of the knee K) of the patient 105 by an imaging method. Arranged on the patient is a local coil arrangement 106 (e.g., connected to an MRI scanner control 117, 110 via an interface In on the patient couch 104), using which, in a local region (e.g., field of view (FOV)) of the MRI scanner, recordings of a portion of the body 105 may be generated in the FOV. Signals of the local coil arrangement 106 may be evaluated (e.g., converted into images, stored or displayed) by an evaluation apparatus (e.g., including elements 168, 115, 117, 119, 120, 121) of the MRI scanner 101 that may be connected to the local coil arrangement 106 by, for example, coaxial cables or by radio (e.g., element 167).

In order to use a magnetic resonance imaging MRI scanner 101 to examine a body 105 (e.g., an examination object or a patient) using magnetic resonance imaging, different magnetic fields are radiated onto the body 105. The magnetic fields are matched very precisely to one another in terms of temporal and spatial characteristics. A strong magnet (e.g., a cryo-magnet 107) in a measuring cabin with an opening 103 (e.g., tunnel-shaped) generates a static strong main magnetic field $B_0$ that may be, for example, 0.2 tesla to 3 tesla or more. A body 105 to be examined, supported by a patient couch 104, is driven into a region of the main magnetic field $B_0$, which is approximately homogeneous in the observation region FOV. The nuclear spins of atomic nuclei of the body 105 are excited by magnetic radiofrequency excitation pulses $B1(x, y, z, t)$ that are, for example, radiated in by a radiofrequency antenna that is illustrated in a highly simplified fashion as body coil 108 (e.g., multipart=108a, 108b, 108c; and/or, optionally, a local coil arrangement). Radiofrequency excitation pulses are generated by, for example, a pulse generation unit 109 that is controlled by a pulse sequence control unit 110. After amplification by a radiofrequency amplifier 111, the pulses are routed to the radiofrequency antenna 108. The radiofrequency system shown is merely indicated schematically. In other embodiments, more than one pulse generation unit 109, more than one radiofrequency amplifier 111 and a plurality of radiofrequency antennas 108a, b, c are employed in a magnetic resonance imaging scanner 101.

The magnetic resonance imaging scanner 101 includes gradient coils $112x$, $112y$, $112z$, by which magnetic gradient fields $B_G(x, y, z, t)$ for selective slice excitation and for spatial encoding of the measurement signal are radiated in during a measurement. The gradient coils $112x$, $112y$, $112z$ are controlled by a gradient coil control unit 114 (and optionally via amplifiers Vx, Vy, Vz) that, like the pulse generation unit 109, is connected to the pulse sequence control unit 110.

Signals emitted by the excited nuclear spins (of the atomic nuclei in the examination object) are received by the body coil 108 and/or at least one local coil arrangement 106, amplified by associated radiofrequency preamplifiers 116 and processed further and digitized by a reception unit 117. The recorded measurement data is digitized and stored as complex number values in a k-space matrix. An associated MRI image may be reconstructed from the k-space matrix filled with values by a multidimensional Fourier transform.

For a coil that may be operated both in the transmission and in the reception mode, such as, for example, the body coil 108 or a local coil 106, the correct signal transmission is regulated by an upstream transmission/reception switch 118.

An image processing unit 119 generates an image from the measurement data. The generated image is displayed to a user via an operating console 120 and/or stored in a storage unit 121. A central computer unit 122 controls the individual components of the installation.

In MR imaging, images with a high signal-to-noise ratio (SNR) may be recorded using local coil arrangements (e.g., coils, local coils). The local coil arrangements are antenna systems that are attached in the direct vicinity on (anterior) or under (posterior) or at or in the body 105. During an MR measurement, the excited nuclei induce a voltage in the individual antennas of the local coil. The induced voltage is amplified using a low-noise preamplifier (e.g., LNA, preamp) and relayed to the reception electronics. In order to improve the signal-to-noise ratio, even in the case of high-resolution images, high field installations (e.g., 1.5 T-12 T or more) are used. If it is possible to connect more individual antennas to an MR reception system than there are receivers available, then, for example, a switching matrix (e.g., RCCS) is installed between reception antennas and receiver. The switching matrix routes the currently active reception channels (e.g., the reception channels that currently lie in the field of view of the magnet) to the available receivers. As a result of this, more coil elements than there are receivers available may be connected since, in the case of a whole body coverage, only the coils that are situated in the FOV or in the homogeneity volume of the magnet are to be read out.

By way of example, an antenna system that may, for example, include one antenna element or, as an array coil, a plurality of antenna elements (e.g., coil elements) may be referred to as local coil arrangement 106. These individual antenna elements are, for example, embodied as loop antennas (e.g., loops), butterfly coils, flex coils or saddle coils. By way of example, a local coil arrangement includes coil elements, a preamplifier, further electronics (e.g., sheath current chokes), a housing, supports and may include a cable with plugs by which the coil elements are connected to the MRI scanner. A receiver 168, attached on the installation side, filters and digitizes a signal received from a local coil 106 (e.g., by radio) and transmits the data to a digital signal processing apparatus that may derive an image or a spectrum from the data obtained by a measurement and makes the image or spectrum available to the user for, for example, a subsequent diagnosis by the user and/or for storage purposes.

FIGS. 1-4 clarify embodiments of methods and MRI scanners.

Figure 1:
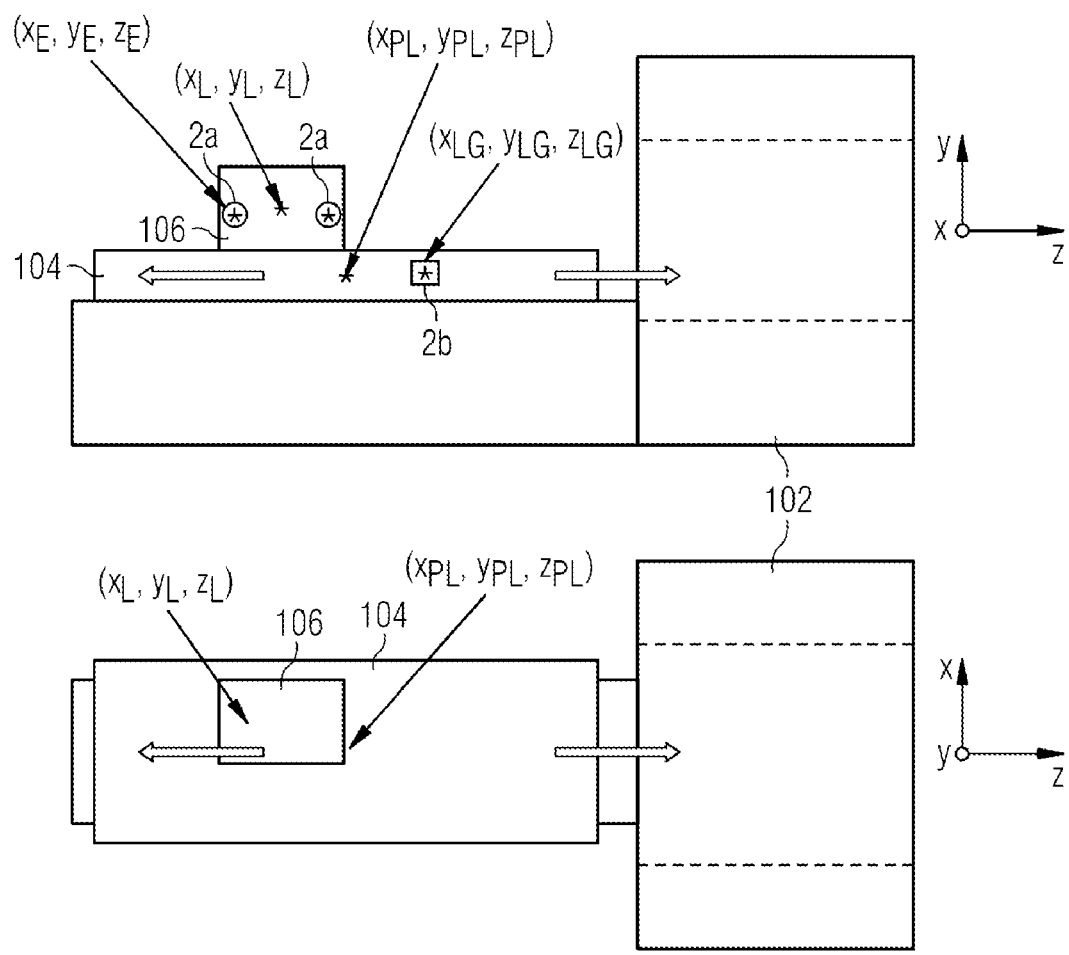
FIG. 1 shows in a side view at the top and in a top view at the bottom one embodiment of a local coil as a transmission/reception coil on a patient couch during entry into a bore of a magnetic resonance imaging (MRI) scanner.

As shown in a simplifying manner in FIG. 1, a patient 105 may be transported into and out of the measurement region FOV of a magnetic resonance imaging (MRI) scanner 101 lying on a patient table 104. In some measurement methods, local coils 106 (e.g., coils) are attached to the patient table 104 in the vicinity of the body tissue K to be examined. The local coils serve for receiving and/or transmitting electromagnetic signals. There is a plurality of different types of coils, and every coil or coil arrangement has individual features. The coils or coil arrangements may be placed onto the patient table at different positions and may, for example, be affixed and/or connected at the patient table via an interface In. The MRI system should know the position of the employed local coils (e.g., local coil arrangements or arrays) relative to the patient table 104 sufficiently well to be able to displace the patient table 104 relative to the MRI scanner housing 102 in a suitable fashion (e.g., particularly in the +z and −z direction).

How the MRI scanner measurement system should know the position $(x_L, y_L, z_L)$ of the local coils 106 or local coil arrangements on the patient table 104 was previously solved differently (e.g., by mechanical encoding or light visors according to a known solution). MRI systems known at least internally also make use of optical measurement systems. An optically identifiable marking is attached to the local coil (e.g., local coil arrangement or array). The local coil (e.g., local coil arrangement or array) is mounted on the patient table at a position that depends on the coil type, the patient and the body tissue to be examined. An optical measurement apparatus (e.g., light pointer) is situated at the entrance to the MRI scanner housing (e.g., MRI scanner measurement tube). The patient table with patient and local coil (e.g., local coil arrangement or array) is manually inserted into the MRI scanner housing (e.g., MRI scanner measurement tube) until the light signal of the optical measurement apparatus points onto the marking on the local coil (e.g., local coil arrangement or array). The correspondence of the marking with the optical pointer is manually communicated to the MRI system. Since the current position of the patient table relative to the MRI scanner housing is known to the MRI system, the position of the local coil (e.g., local coil arrangement or array) may therefore be calculated relative to the patient table. This process uses manual intervention by the operating staff and uses a substantial part of the whole examination time.

Mechanical encoding methods may be disadvantageous because the mechanical encoding methods prescribe a fixed position of the coil on the patient table. By way of example, in the case of the knee coil, this requires the patient, after lying on the patient table, to slide (or be moved) once again in the longitudinal direction of the table in order to position the knee precisely in the center of the coil. This may be disadvantageous for the patient workflow. In other words, the restricted spatial flexibility of the coil positioning may involve disadvantages in the workflow.

There are known MR-based methods that employ the spectrum of the received MR signal in order to detect the coil position in the MRI scanner measurement tube. However, these methods only work in the homogeneity volume and use techniques similar to MR imaging (e.g., gradients, transmission pulses, evaluation of the RX spectrum).

According to one embodiment, the position $(x_L, y_L, z_L)$ of the local coil 106 or the positions of a plurality of local coils 106 (e.g., also in the form of local coil arrangements or arrays) is positionally determined relative to a position $(x_{PL}, y_{PL}, z_{PL})$ of a patient couch 104 with the aid of electronically wirelessly readable labels 2a and reading units 2c, 2d, 110 with reading-unit antennas 2b. Each local coil (e.g., local coil arrangement or array) and/or the patient table (e.g., a spinal column coil contained therein) are provided with at least one electronically readable label 2a.

Here, for example, the center and/or the front boundary in the z direction and/or the rear boundary counter to the z direction and/or the upper boundary in the y direction and/or the lower boundary counter to the y direction and/or the front boundary in the x direction and/or the rear boundary counter to the x direction of the local coil housing may be determined as position $(x_L, y_L, z_L)$ of a local coil 106 (e.g., in one or two or three directions x, y, z). For example, the center and/or the front boundary in the z direction and/or the rear boundary counter to the z direction and/or the upper boundary in the y direction and/or the lower boundary counter to the y direction and/or the front boundary in the x direction and/or the rear boundary counter to the x direction of the patient couch 104 may be determined as position $(x_{PL}, y_{PL}, z_{PL})$ of a patient couch 104 (e.g., in one or two or three directions x, y, z). A position may also be a spatial region (e.g., around a precise position).

Each label 2a carries a unique ID number 21 that is only allocated once and, for example, transmitted wirelessly (F) with signals S.

Figure 2:
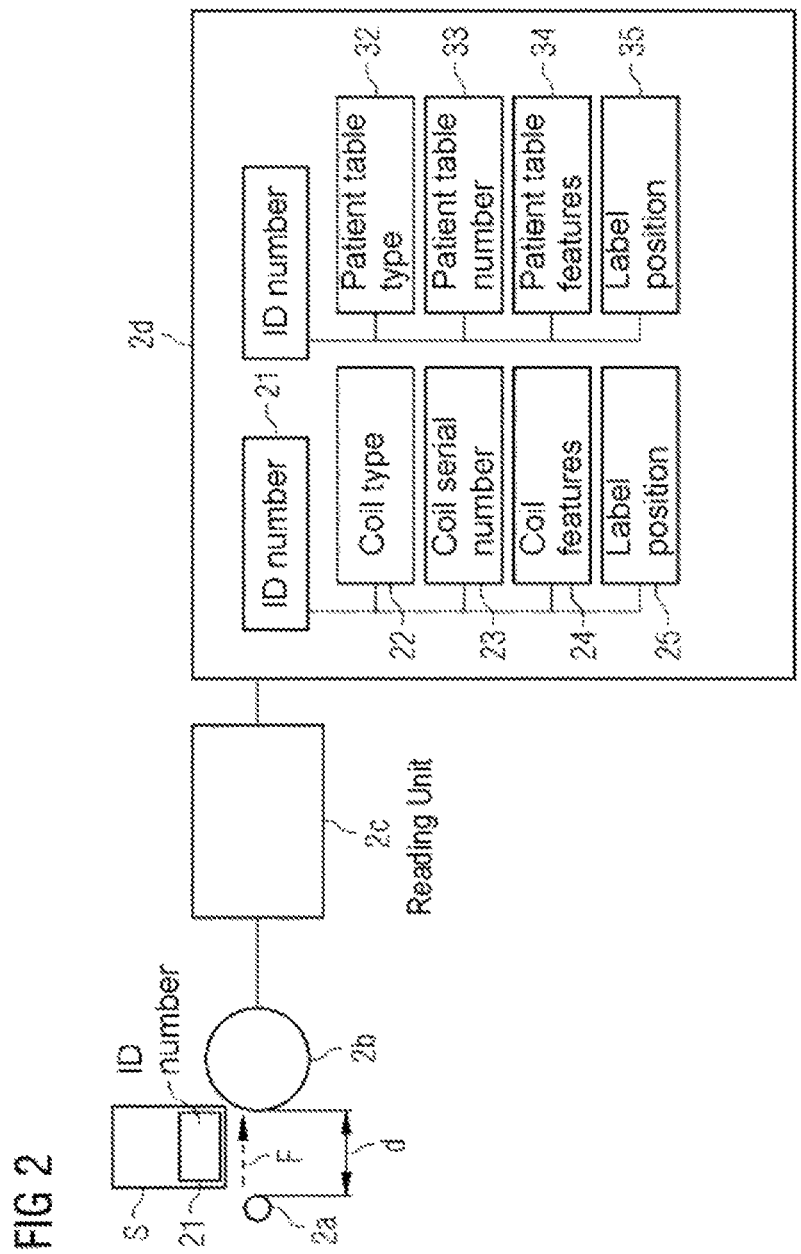
FIG. 2 shows one embodiment including a label, a reading unit and a database with local coil identity numbers.
Figure 3:
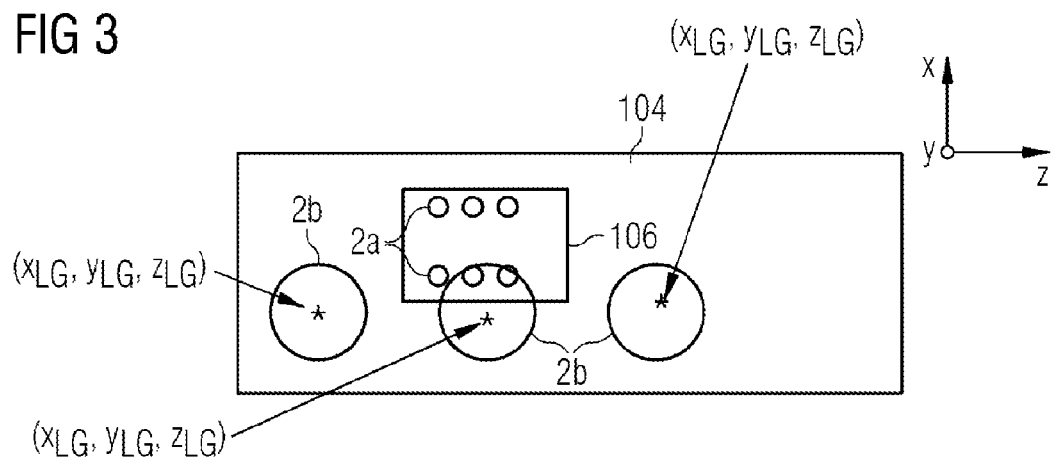
FIG. 3 shows a top view of one embodiment of a local coil provided with six labels on a patient table on which reading-unit reading antennas are arranged for reading signals emitted by the labels.

Relevant data with respect to the local coil 2a on which the at least one label 2a is arranged, including the position $(x_E, y_E, z_E)$ of the label 2a, is stored in a database 2d that is illustrated in a simplifying manner in FIG. 2.

The ID numbers 21 of the electronically readable labels 2a may be read out wirelessly by appropriate reading units 2c with reading-unit antennas 2b. At least one reading unit 2c with at least one reading antenna 2b is, depending on the embodiment, attached to the patient table 104 or integrated in the patient table 104 and/or introduced into the local coil 106 (e.g., local coil arrangements or arrays). If a local coil 106 (e.g., local coil arrangements or arrays) is assembled on the patient table 104 or brought into the vicinity of the patient table 104, one or more labels 2a enter into the reading region of the opposing reading unit 2c or of the reading antenna 2b thereof. With the aid of the database 2d, the position ($x_E$, $y_E$, $z_E$) of the label 2a may be established relative to the patient table 104 or relative to the local coil housing of a local coil 106 from the ID number 21 of each label 2a.

By way of example, the positions ($x_{LG}$, $y_{LG}$, $z_{LG}$) of all reading units 2c or the reading antennas 2b thereof and the positions ($x_E$, $y_E$, $z_E$) of all labels 2a are known. If this ($x_{LG}$, $y_{LG}$, $z_{LG}$), ($x_E$, $y_E$, $z_E$) position information is combined, the positions ($x_L$, $y_L$, $z_L$) of the local coils 106 (e.g., local coil arrangements or arrays) may be determined relative to the patient table 104 without it being necessary for the local coils 106 or local coil arrangements or the patient table 104 to be moved.

According to one embodiment, a local coil 106 or local coil arrangement is attached to the patient table 104 at the body site to be examined and connected to the MRI system 101, 110 (e.g., via a cable via an interface In on the patient table 104). For the actual MRI recording, the patient table 104 with patient 105 and local coil 106 is driven into the bore 103 of the MRI scanner housing (e.g., FIG. 1, 1c) 102 and subsequently driven out of the bore again (e.g., FIG. 1).

In contrast to other methods for determining the position of local coils on the patient table at a magnetic resonance imaging scanner, the interaction of electronically wirelessly (e.g., by radio and/or RFID radio link) readable labels 2a with reading units 2c is used in this embodiment to establish the position ($x_L$, $y_L$, $z_L$) of the local coils 106.

One embodiment of a system with electronically wirelessly readable labels 2a includes at least one reading unit 2c with one or more reading antennas 2b, integrated therein or spatially separated therefrom, and one or more electronically wirelessly (e.g., by radio F and/or RFID) readable labels 2a. Stored in each label 2a is at least one ID number 21 that is only allocated once and may be read wirelessly (F) by the reading unit 2c over a definable distance d between reading antenna and label. Using the read ID number 21 of the label 2a, the MRI system 101 establishes from a database 2d, in addition to other data, the position ($x_E$, $y_E$, $z_E$) of the label relative to the local coil 106 or relative to the patient table 104, on which the label 2a is applied immovably.

In order to determine the position of the local coil 106 (e.g., local coil arrangement or array) relative to the patient table 104 by the MRI system 101, 110, 2d, several variants may be provided. In accordance with FIG. 3, one or more electronically readable labels 2a are attached to the housing of the local coil (e.g., local coil arrangement or array) at a plurality of known positions or integrated in the housing. A plurality of reading units with, in each case, at least one reading antenna 2b are attached onto or in the vicinity of the patient table 104 at known positions ($x_{LG}$, $y_{LG}$, $z_{LG}$) or integrated in the patient table 104. If a local coil 106 (e.g., local coil arrangement or array) is brought into the vicinity of the patient table 104 (e.g., into the adjustable reading region of a reading antenna 2b of a reading unit), the ID number 21 of one or more labels 2b housed at or in the housing of a local coil 106 may be read by the MRI system. Conclusions about the region (around ($x_E$, $y_E$, $z_E$)) at or over the patient table 106 in which the label and hence the coil housing of the local coil 106 are situated may be drawn from the information relating to which of the reading antennas 2b has read the label 2a (e.g., position determination of the position of the local coil 106 relative to the patient table 104). The smaller the reading region (e.g., the spatial reception region or the maximum reception distance d) of the reading units 2b, 2c is selected to be, the higher the achievable spatial resolution is and the more reading units 2c or reading antennas 2b may or should be used. The mutual influence of reading units 2c or reading antennas 2c situated next to one another may be controlled by known methods (e.g., temporally distributed measurement or different work frequencies).

In this embodiment, it is also possible to identify if a plurality of local coils 106 (e.g., local coil arrangement or array) are brought into the vicinity of the patient table 104. From the read ID numbers 21 of the local coils 106, local coil-related data (e.g., coil type 22, coil serial number 23, coil features 24, label position 25 of the label on the local coil) are established with the aid of the database 2d.

Figure 4:
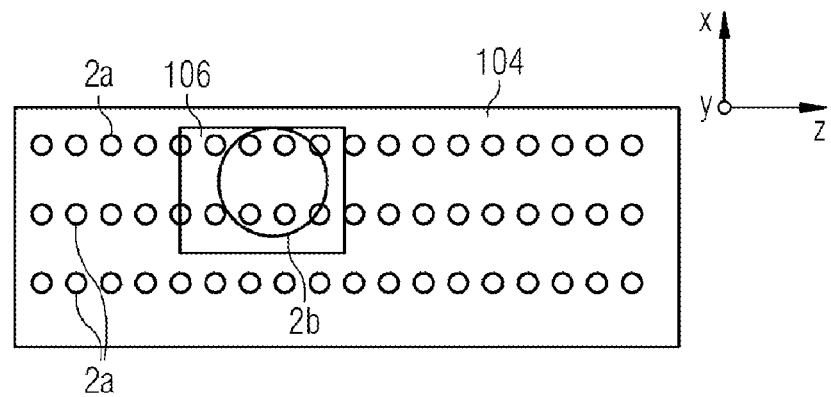
FIG. 4 shows a top view of one embodiment of a local coil provided with a reading-unit reading antenna on a patient table on which labels are arranged for transmitting signals for the reading-unit reading antennas.

In one embodiment in accordance with FIG. 4, a plurality of electronically readable labels 2a are attached distributed at known different positions ($x_E$, $y_E$, $z_E$) on the patient table 104 or on a coil (e.g., a spine coil or spinal column coil) fixedly connected to the patient table 104 (e.g., inserted/installed therein) or integrated in the patient table 104. One or more reading units or the associated reading antennas 2b are attached to the housing of the local coil 106 (e.g., local coil arrangement or array) at known (marked by a *) positions ($x_{LG}$, $y_{LG}$, $z_{LG}$) or integrated in the local coil housing. If a local coil 106 (e.g., local coil arrangement or array) is brought into the vicinity of the patient table 104 (e.g., into the adjustable reading region (d) of a reading antenna 2b of a reading unit 2c), the ID number 21 of one or more labels 2a housed on or in the patient table 104 may be read by the reading unit(s) in the local coil 106 or local coil arrangement. Conclusions about the region (around ($x_E$, $y_E$, $z_E$)) at or over the patient table 104 in which the housing of the local coil is situated may be drawn from the ID numbers 21 of the read labels 2a (e.g., position determination of the housing of the local coil relative to the patient table 104).

The smaller the distance between the labels 2a on the patient table 104 is selected to be, the higher the achievable spatial resolution is. The mutual influence of labels 2a situated next to one another may be controlled by known methods (e.g., small antenna shapes or different work frequencies).

As a result of communication between the local coil 106 or the local coil arrangement and the MRI system, the overall system 117, 110 may also identify if there is more than one local coil 106 (e.g., local coil arrangement or array) in the vicinity of the patient table 104. In this embodiment, patient table-related data (e.g., at least patient table type 32, patient table serial number 33, patient table features 34, label position 35 on the patient table) is established from the read ID number 21 with the aid of a database 2d as per, for example, FIG. 2.

The two variants described above may be combined. At least one electronically readable label 2a is attached to or integrated in both the patient table 104 and the housing of the local coil 106 (e.g., local coil arrangement or array). Similarly, at least one reading unit 2c with in each case at least one reading antenna 2b is attached both in the vicinity of or in the patient table 104 and at or in the housing of the local coil 106 (e.g., local coil arrangement or array). A negative influence of the individual reading unit/label systems amongst themselves may be avoided by known methods (e.g., temporally separate operation or combination of different label systems).

In this variant, labels 2a on the local coil housing 106 may be read by reading units 2b, 2c on the patient table 104, and labels 2a on the patient table 104 may be read by reading units 2b, 2c on the local coil 106. By combining this data, the identification reliability and the accuracy of the position determination may be further increased. In this embodiment, patient table-related and/or coil-related data (e.g., at least patient table type 32, patient table serial number 33, patient table features 34, label position 35 on the patient table, coil type 22, coil serial number 23, coil features 24, label position 25 on the coil) are established, for example, from the read ID number 21 with the aid of the database (e.g., FIG. 2, 2d), depending on the reference point of the label 2a.

Compared to known, previously employed methods for determining the position of local coils on a magnetic resonance imaging scanner, an advantage that may be provided by employing electronically wirelessly readable labels is that the position determination of MRI systems may take place automatically, without manual intervention, depending on the embodiment, without electric contact either between local coil and MRI system, and without manual positioning such as displacing the patient table. (e.g., moving the coil under the patient or operating an optical measurement system).

Additionally, the position determination may be carried out in a comparatively short time. The overall time of the MR preparation of the patient is reduced, the operating staff and the patients may be unburdened, and the costs per recording will be reduced. The position determination may take place before the patient table enters the MRI scanner housing (e.g., MRI scanner measurement tube).

As a result, feedback in relation to incorrect operations (e.g., inadmissible coil positions) may be provided immediately to the operating staff. In the case of the previous methods, the patient table was completely driven out of the MRI scanner housing, the position of the local coil (e.g., local coil arrangement or array) was corrected, and the patient table was once again moved in for the renewed position determination.

As a result of using the electronically readable labels, together with the data stored in a database, the identification of the utilized local coils or coil arrangement may be achieved without additional complexity by the MRI system. As a result, only types and an approved number of coils or coil arrangements that are approved for the utilized measurement mode and only of properly functioning units are used. As a result of the fact that each local coil (e.g., local coil arrangement or array) is identified individually, the MRI system may set itself to the individual features of the local coil or the local coil arrangement. The safety of the patient and the reliability of the measurement system, as well as the quality of the MRI scanner measurement results, are increased.

A possible additional use of this method includes the detection of local coils not plugged onto the MR system that may constitute a potential risk to the patient (e.g., vibrating of the local coil by coupling with the "body coil" and therefore increased SAR values). This identification may also be of assistance in meeting the "IEG 60601 2nd Edition" standard and may make other testing methods superfluous.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device for identifying a position of a local coil of a magnetic resonance imaging scanner relative to a position of a patient couch, the device comprising:
   at least one label that is configured to transmit a signal with at least one identity number wirelessly;
   at least one reading unit comprising a reading-unit antenna, the at least one reading unit being configured to receive the signal; and
   a position determination apparatus that is configured to determine the position of the local coil relative to the patient couch.

2. The device as claimed in claim 1, wherein the position determination apparatus is configured to determine the position of the local coil relative to the position of the patient couch while the patient couch is static, unmoved, or static and unmoved relative to a housing of a magnetic resonance imaging (MRI) scanner, while the patient couch is still situated outside of the MRI scanner, or a combination thereof.

3. The device as claimed in claim 1, wherein the reading-unit antenna is arranged on the local coil and the at least one label is arranged on a patient table, the reading-unit antenna is arranged on the patient table and the at least one label is arranged on the local coil, or a combination thereof.

4. The device as claimed in claim 1, wherein the position determination apparatus is configured to determine the position of the local coil relative to the position of the patient couch based on a position of the reading-unit antenna, a position of the at least one label on the local coil, or a combination thereof.

5. The device as claimed in claim 1, wherein the position of the local coil relative to the reading-unit antenna, relative to the at least one label on the reading-unit antenna, or a combination thereof is determinable by a database based on the at least one identity number transmitted by the at least one label.

6. The device as claimed in claim 1, wherein the position determination apparatus is configured to determine the position of the local coil relative to the patient couch taking into account a signal strength, presence of a reception of the signal received from the reading-unit antenna, or a combination thereof.

7. The device as claimed in claim 1, wherein the position determination apparatus is configured to determine the position of at least the local coil relative to the patient couch taking into account a signal strength, presence of a reception of signals received from a plurality of reading-unit antennas, the signals comprising the signal, the plurality of reading-unit antennas comprising the reading-unit antenna.

8. The device as claimed in claim 1, wherein a plurality of reading-unit antennas are arranged on the local coil, a plurality of labels are arranged on a patient table, or a combination thereof, the plurality of reading-unit antennas comprising the reading-unit antenna, the plurality of labels comprising the at least one label.

9. The device as claimed in claim 1, wherein a plurality of reading-unit antennas are arranged on a patient table, a plurality of labels are arranged on the local coil, or a combination thereof, the plurality of reading-unit antennas comprising the reading-unit antenna, the plurality of labels comprising the at least one label.

10. The device as claimed in claim 1, wherein each label of the at least one label is configured to transmit the at least one identity number, is readable wirelessly by the at least one reading unit, or a combination thereof.

11. The device as claimed claim 1, wherein each label of the at least one label is an RFID label that transmits an RFID signal, and
wherein each reading unit of the at least one reading unit is an RFID reading unit.

12. The device as claimed in claim 1, wherein the at least one reading unit comprises only one reading unit.

13. The device as claimed in claim 1, further comprising a control configured to determine a position of one or more labels relative to one or more reading-unit antennas.

14. The device as claimed in claim 1, wherein at least one ID number is stored in each label of the at least one label, the at least one ID number being stored in no other label of the at least one label.

15. The device as claimed in claim 1, wherein the at least one reading unit is configured to establish at least a position of the at least one label on the local coil, to which the at least one label is attached, with the at least one identity number of the at least one label read by the reading unit using a database.

16. The device as claimed in claim 1, wherein one or more labels are attached to a housing of a local coil arrangement or the local coil, are integrated into the housing of the local coil arrangement or the local coil, or a combination thereof.

17. The device as claimed in claim 1, wherein one or more reading units, reading antennas, or the one or more reading units and the reading antennas are attached to a stationary part of the patient couch, in a spinal column coil arrangement positioned in a stationary manner in the patient couch, or a combination thereof.

18. The device as claimed in claim 1, wherein a local coil not plugged onto the patient couch is detectable, the detection comprising a comparison of each plugged-in local coil detected at an interface on the patient couch with local coils detected on the basis of identity numbers received from labels.

19. The device as claimed in claim 1, wherein the reading-unit antenna of the at least one reading unit and the at least one label are situated outside of a field of view of the MRI scanner during detection of the at least one label by the at least one reading unit.

20. The device as claimed in claim 1, wherein the local coil is arranged in an unfixed fashion, a movable fashion, a non-integrated fashion, or a combination thereof on a patient table.

21. The device as claimed in claim 1, wherein the local coil is a local coil arrangement, a local coil array, or a local coil arrangement and local coil array.

22. A method for identifying a position of a local coil of a magnetic resonance imaging (MRI) scanner relative to the position of a patient couch, the method comprising:
receiving, by at least one reading-unit antenna of a reading unit, an identity number transmitted wirelessly by at least one label;
determining, with a position determination apparatus, a position of the at least one label relative to the at least one reading-unit antenna, and the position of the local coil of the MRI scanner relative to the position of the patient couch.

23. The method as claimed in claim 22, wherein determining the position of the local coil of the MRI scanner relative to the position of the patient couch comprises determining the position of the local coil relative to the position of the patient couch when the patient couch is still situated outside of the MRI scanner, immobile or static relative to the MRI scanner.

24. The method as claimed in claim 22, wherein reading-unit antennas are arranged on the local coil and labels are arranged on a patient table, the reading-unit antennas are arranged on the patient table and the labels are arranged on the local coil, or a combination thereof.

* * * * *